(12) United States Patent
Kossin

(10) Patent No.: US 7,920,163 B1
(45) Date of Patent: Apr. 5, 2011

(54) SEALED, WATERPROOF DIGITAL ELECTRONIC CAMERA SYSTEM AND METHOD OF FABRICATING SAME

(75) Inventor: Philip Kossin, Los Angeles, CA (US)

(73) Assignee: Tessera International, Inc., San Jose, CA (US)

( * ) Notice: Subject to any disclaimer, the term of this patent is extended or adjusted under 35 U.S.C. 154(b) by 0 days.

(21) Appl. No.: 11/332,012

(22) Filed: Jan. 13, 2006

Related U.S. Application Data

(63) Continuation-in-part of application No. 09/808,912, filed on Mar. 14, 2001, now Pat. No. 6,987,527, which is a continuation-in-part of application No. 09/333,825, filed on Jun. 15, 1999, now Pat. No. 6,795,110.

(51) Int. Cl.
*H04N 7/18* (2006.01)
*H04N 5/232* (2006.01)
*H04N 5/225* (2006.01)
*G03B 17/08* (2006.01)

(52) U.S. Cl. .......... 348/81; 348/211.2; 348/373; 396/25

(58) Field of Classification Search .................... 348/81, 348/211.2, 373; 396/25
See application file for complete search history.

(56) References Cited

U.S. PATENT DOCUMENTS

| | | | |
|---|---|---|---|
| 3,688,029 A | 8/1972 | Bartoe, Jr. et al. | |
| 3,899,790 A | 8/1975 | Pocachard | |
| 3,952,190 A | 4/1976 | Perkins | |
| 3,958,080 A | 5/1976 | Schadler | |
| 4,009,419 A | 2/1977 | Ligman | |
| 4,025,930 A * | 5/1977 | Wolff | 396/29 |
| 4,153,357 A | 5/1979 | Winnacker et al. | |
| 4,184,758 A | 1/1980 | Winnacker | |
| 4,268,858 A | 5/1981 | Wood | |
| 4,977,418 A | 12/1990 | Canty | |
| 5,068,720 A | 11/1991 | Herlitz et al. | |
| 5,089,895 A | 2/1992 | Fraker et al. | |
| 5,107,286 A | 4/1992 | Sergeant et al. | |
| 5,305,030 A * | 4/1994 | Yokoyama et al. | 396/27 |
| 5,455,466 A | 10/1995 | Parks et al. | |
| 5,678,091 A | 10/1997 | Daspit | |
| 5,694,169 A | 12/1997 | Noji | |
| 5,847,753 A | 12/1998 | Gabello et al. | |
| 5,956,291 A * | 9/1999 | Nehemiah et al. | 367/131 |
| 6,091,443 A | 7/2000 | Ford et al. | |
| 6,119,630 A | 9/2000 | Lobsiger et al. | |
| 6,128,441 A | 10/2000 | Kamata et al. | |
| 6,355,881 B1 | 3/2002 | Braeges et al. | |
| 6,525,762 B1 | 2/2003 | Mileski et al. | |
| 6,614,722 B2 * | 9/2003 | Polany et al. | 367/131 |
| 6,707,274 B1 * | 3/2004 | Karr | 320/107 |
| 6,803,943 B2 * | 10/2004 | Yamamuro | 348/81 |
| 6,839,082 B2 | 1/2005 | Lee et al. | |
| 2002/0067425 A1 * | 6/2002 | Iverson | 348/373 |
| 2005/0151876 A1 * | 7/2005 | Karr | 348/373 |

* cited by examiner

*Primary Examiner* — Justin P Misleh
(74) *Attorney, Agent, or Firm* — Lerner, David, Littenberg, Krumholz & Mentlik, LLP

(57) ABSTRACT

A hermetically sealed digital electronic camera that is designed to operate both on land and underwater to great depths, and method of making same. The present invention is a camera which is hermetically sealed by being totally encapsulated, preferably by being cast in plastic, with no seals, holes, joints, penetrating pins, wires or other objects. Wireless means are used for communicating information, electrical power and control signals. The invention is impervious to atmospheric contamination and absolutely incapable of leaking under water to great depths and pressures. In an alternate embodiment camera optics are not encapsulated but are immersed in water when the encapsulated digital camera is placed in water.

10 Claims, 12 Drawing Sheets

SEALED, WATERPROOF DIGITAL ELECTRONIC CAMERA SYSTEM AND METHOD OF FABRICATING SAME

CROSS-REFERENCE TO RELATED PATENT APPLICATIONS

The present patent application is a continuation-in-part of U.S. patent application Ser. No. 09/808,912, filed Mar. 14, 2001, now U.S. Pat. No. 6,987,527 B1 issued Jan. 17, 2006 for a SEALED, WATERPROOF DIGITAL ELECTRONIC CAMERA SYSTEM AND METHOD OF FABRICATING AND COMMUNICATING WITH SAME; which is a continuation-in-part of U.S. patent application Ser. No. 09/333,825 filed Jun. 15, 1999, now U.S. Pat. No. 6,795,110 B1, issued Sep. 21, 2004, for a WEATHERPROOF AND WATERTIGHT DIGITAL ELECTRONIC CAMERA, INCLUDING A SOLID OR FLUID-FILLED DIGITAL CAMERA OPERATING AT GREAT DEPTHS to the selfsame inventor as the present application. The specifications and claims of the related predecessor patent application are incorporated herein by reference.

BACKGROUND OF THE INVENTION

1. Field of the Invention

The present invention generally concerns digital electronic cameras, and waterproof housings for cameras including digital electronic cameras.

The present invention particularly concerns (i) digital electronic cameras encapsulated in plastic, with no seals or penetrating pins, wires or other objects whatsoever, (ii) digital electronic cameras so encapsulated with no air or other gas whatsoever inside, (iii) digital electronic cameras with water-immersed adjustable optics, and (iv) the communication of information, electrical power and control across a watertight barrier particularly as may encapsulate and protect a digital electronic camera.

2. Description of the Prior Art
2.1 Relevant Previous Patents

A significant body of prior art concerning waterproof housings for conventional film cameras is substantially irrelevant to the present invention for several reasons. First, the housing or case for a conventional, non-electronic, camera must open for retrieval and replacement of the film—as will prove to be unnecessary with a digital electronic camera. Second, since the camera's case or housing will open, and required replacement of batteries is readily accomplished by physical substitution, no battery recharging need transpire through the case or housing.

The case and its waterproof seals can be, and often are, quite sophisticated in supporting the transmission of mechanical forces and adjustments as may attend, inter alia, adjustment of the camera's focus and/or the actuation of its shutter. However, and although a digital electronic camera may have a focus adjustment and will have a shutter, these mechanisms can be electrically, as opposed to mechanically, actuated.

Accordingly, the present invention will prove more analogous to certain prior art underwater electronic devices—including electronic imaging devices such as, inter alia, a video tape recorder—than to underwater film cameras. (Of course, even with a video tape recorder, a watertight enclosure will open for access to the videotape.)

In this regard, U.S. Pat. No. 3,952,190 to Perkins for an UNDERWATER STROBE FLASH UNIT concerns a method of waterproofing a strobe flash unit for use in underwater photography. A mold is formed and a strobe flash unit is mounted within the mold. Epoxy resin is poured into the mold to surround the strobe flash unit with the resin. The resin is then cured until it hardens, at which time the mold is removed from the epoxy resin and strobe flash unit. The resultant product is a strobe flash unit encapsulated in a transparent waterproof casing. Such encapsulation will be seen to be suitably employed in the present invention.

As regards the communication of power to handheld underwater electronic imaging devices, U.S. Pat. No. 4,009,419 to Ligman for a SAFETY CIRCUIT FOR VIDEO DIVER concerns an underwater diver who is provided with a video camera, light, and communications all of which is supplied with electrical current from the surface by a shipboard electrical circuit. The diver is protected from accidental excessive voltages and current by magnetically isolating the diver's current from the shipboard current and by employing optical feedback to control the voltages for the diver. Additionally, a standby battery is employed to energize this equipment when the shipboard power fails. The entire shipboard power supply is contained in a waterproof box upon which is also mounted a video monitor and a video recorder, both secured in watertight fashion to the box. The present invention will be seen to involve the transmission of power into a waterproof enclosure, but not while the enclosure is immersed, and normally not while an electronic digital camera within the enclosure is in use.

The present invention will be seen to involve optical data transmission. U.S. Pat. No. 5,847,753 to Gabello, et al., for a CAMERA SYSTEM FOR SCANNING A MOVING SURFACE concerns a camera system utilizing a line scan (linear array) camera designed to scan a moving surface and subsequently to generate and to transmit a high quality digitized video signal over a long a distance by an optical fiber. The primary function of the system is: to scan a moving surface using a 2048 or a 1024 linear array; to condition and digitize the array analog video signal; and subsequently to transmit to a computer processing unit, without a noticeable loss in fidelity, the digitized video data over a long distance by means of an optical fiber connected to the camera and the computer processing unit. The system also functions to transmit both video signals and non-video information signals over a fiber optic link from the camera to the computer processing unit.

2.2 An Exemplary Modification of an Existing Digital Camera

The present invention will be seen to employ but very, very slight—substantially inconsequential—physical and electrical modifications to an existing digital electronic camera. No modifications at all are required by the present invention in the personal computer, nor in the operating software, that are commonly used to recover digital images from the digital electronic camera. However, all these things are readily susceptible of modification, if required.

It is thus useful to consider the susceptibility of a digital electronic camera to electrical and/or physical modification. An example of modifications—much more extensive than are required by the present invention—to an existing digital camera to support of its use in a non-standard, space borne, environment is shown in a Stanford University student project reported on the World Wide Web.

2.2.1 An Exemplary Existing Digital Electronic Camera

The Logitech Fotoman Plus digital electronic camera is a 8-bit grayscale digital camera, capable of storing 32 JPEG compressed pictures in memory. Its specifications, according to Logitech, are as follows:

The camera dimensions are 16.8 centimeters (6.7 inches) by 8.1 cm (3.2 in) by 3 cm (1.2 in). The camera weight is 284 grams (10 ounces).

Camera image quality is 256 gray levels over 496.times.360 pixels, for an equivalent resolution of 120 dots per inch (120 dpi) over a photo approximately 4 in (12.7 cm) wide.times.3 in (8.9 cm) high.

The lens is fixed focus with a 8.5 millimeters (mm) focal length, f/4.5. The 35 mm camera equivalent focal length is 64 mm. Shooting range is 3 feet (1 meter) to infinity.

The camera's equivalent film sensitivity is approximately ASA 200 without the neutral density filter, and approximately ASA 25 with the filter.

The camera's electronic shutter speed is 40 milliseconds (.about.{fraction (1/30)}) with the flash, and 0.5 to 50 msec ({fraction (1/2000)} to {fraction (1/20)}) without the flash.

The flash guide number equivalent is 27 at ASA 200. The flash shooting range 3 ft (1 m) to 8 ft (2.5 m). The life of the flash is 10,000 flashes.

The image capacity of camera is 32 pictures in an image storage medium: namely, solid state (dram) memory with battery backup.

The image sensor type is a CCD (charge-coupled device). The raw image size is 179 kb (8 bits per pixel). Compressed image size varies with the image. Average compressed image size is 23 kb with 8:1 compression using the JPEG image compression method.

The adapter rings have a small end of 27 mm threaded outer diameter, and a large end of 37 mm threaded inner diameter.

The camera cable length is 6 ft. (2 m) of cable suitable for the camera's RS423 serial interface (which is simply 5 v version of the more universal RS232 serial interface, which will be seen to be the type used in the preferred embodiment of the present invention).

The baud rate of the interface is 9.6 K baud receive, and 9.6K, 19.2K, 38.4K, 57.6K, of 115 k baud transmit.

The main power source of the camera is two rechargeable nickel-cadmium batteries, AA size, 600 ma, 1.2 V. The time needed to charge these Ni-Cad batteries is 6 hours minimum. In estimating loss of charge in the Ni-Cad batteries assume that, at room temperature, the batteries lose about 20% of a full charge every time the camera takes one full load of photos (32 photos). The batteries lose about 15% of a full charge every time the camera goes 24 hours without recharging.

The battery charger has an output 12 vdc v, −2 v, 500 mah minimum. The polarity-positive pole is at center.

A memory power source is based on a 3 v lithium cell.

Camera operating temperature and humidity is 0 to 40.degree. C. at 95% humidity or less. Camera storage temperature and humidity is −40 to 50.degree. C. at 95% humidity or less.

An existing Logitech Fotoman Plus digital camera (the "Fotoman camera") is modified by, among other things, placing it in a protective box. The capabilities of this digital camera include JPEG image compression, storage in DRAM of up to 32 496.times.360 images with 8-bit gray scale in compressed form. The compression results in a JPEG image size of about 23 Kb.

A serial link to the CPU, RS-232, is used to load into the Fotoman camera memory its operating software, to give it instructions, and to transfer back the camera status and full images.

The digital camera can be powered on/off, from the V bus of the spacecraft. A voltage regulator and a bypass capacitor are used to replace the Ni-Cad batteries normally used to power the Fotoman Plus (see schematic) A lithium battery, used by the Fotoman to maintain the operating software in memory, is left in the camera.

2.2.2 Exemplary Previous Electrical Modifications to an Existing Digital Electronic Camera In accordance with the present invention, connection will be made to the circuitry of a digital electronic camera. That a connection to—and more, rising to the level of actual modification of—the circuitry of an existing digital electronic camera might be made is known.

For example, the aforementioned Fotoman Plus digital electronic camera was subjected to electronic modifications. The Fotoman Plus camera was already designed with appropriate digital communications interfaces without the need for any custom adapter. However, an external switch controlled by the on/off command from the CPU and voltage regulation had to be added. It was so added by wiring an existing RS423 serial interface from a bottom 6 electrodes already present in the camera. (With the lens on top, the six electrodes from left to right are: 1. Connection directly to the battery through a fuse, located in the camera, which is used to monitor battery level in manufacturing. A battery eliminator could be connected, but the fuse would have to be bypassed; 2. RS423 out; 3. Charge in (V); 4. RS423 in; 5. Ground, used for both power and RS423; and 6. Unused.)

Next, a power regulation and switching circuit were designed to turn on the Fotoman camera if a "on" signal was received from the CPU through the bus of the space satellite in which the modified camera was to be flown, and contained.

Finally, the flash had to be selectively electronically disabled by removing certain components off the PCB. (The components were C32, Q18, Q24, Q27, R94, and R93, as indicated on the printed circuit board of the camera.)

2.2.3 Exemplary Modifications to the Software-Based Interface and Control of an Existing Digital Electronic Camera It will be seen to be one of the strengths of the present invention that no modification is needed to the firmware within the camera, nor the software within a connecting computer. It will be understood, however, that such minor modifications as might be required are well within the skills of a practitioner of the digital computer programming arts.

For example, the Photoman Plus camera has a command set the detail nature of which is not of particular concern in the present application.

Using this instruction set software for control of the camera was modified in accordance with the space mission of the camera.

The Fotoman Plus camera software architecture is based on a boot code stored in the Fotoman Plus camera ROM. This main code stored in the Fotoman Plus camera RAM is known as FOTOWARE. This code operates the Fotoman Plus camera, performs the data compression, and manages the communications with an external computer through a serial link.

The Fotoman Plus camera software architecture is also based on an exploitation code, known as FOTOTOUCH, based on an external computer. This code contains a dialogue/acquisition segment, an executable named FOTOMAN.EXE, and an image processing segment.

Finally, the Fotoman Plus camera software architecture is also based a native mode communication program TERM permitting ASCII commands—used in commanding the Fotoman Plus camera—to be entered via a keyboard.

The camera modification plan called for a special version of the FOTOWARE that permitted programmed (i) disabling of the flash, (ii) manual setting of the exposure time, and (iii) control of the battery counter. The battery counter is a model of the battery maintained by the FOTOWARE, which does not measure any physical quantity from the batteries. However, the battery counter must be above a certain level, before the Fotoman can take a picture.

However, if the camera batteries are removed and replaced, the onboard software assumes that the replacement batteries are uncharged. As the power circuitry for the digital camera replaces the batteries, on power up, the counter will read zero and the camera will not be able to take a picture. By controlling the counter, the programmer(s) can change the erroneous indication of insufficient power, and can take a picture immediately. Flash control is recommended, as the flash will be physically disabled.

FOTOTOUCH or any other standard image manipulation package can be used in the ground station to view and process the images, which are downloaded in standard JPEG format.

2.2.4 Exemplary use of a Modified Existing Digital Electronic Camera

The present invention deals with a digital electronic camera modified for underwater use. It is known to attempt to modify a digital electronic camera for a specific applications environment, to wit: the space borne application of the Fotoman Plus camera.

In that application full new software supports camera dialogue/acquisition with the spacecraft CPU, and interfaces the cameral into the main control module of the spacecraft. This software performs the following tasks: 1. turning on and off the Fotoman Plus; 2. uploading FOTOWARE from the PROM into the Fotoman Plus RAM at a given time; 3. sending orders to take pictures to the Fotoman; 4. Request and receiving status, contact, and image inventory information; and 5. retrieving pictures from the Fotoman, to be stored in the CPU, which will be sent at a later time to the ground station.

These tasks can be performed using the 16 commands set of provided in the Native Mode Toolkit. Typical tasks for the modified FotoMan executable under software control are to 1. take a picture at a given time (using the on-board clock); and 2. download a picture #n stored in CPU memory.

For further explanation see the Fotoman Plus camera User's Guide (a basic user's guide) and the Fotoman Plus Camera Native Mode Toolkit (logical interface specifications) supplied by Logitech Inc., Fremont Calif. 94555.

SUMMARY OF THE INVENTION

The present invention contemplates a weatherproof and watertight digital camera that is designed to operate both on land and underwater to great depths. The camera is preferably hermetically sealed, and is thus impervious to contamination both from the atmosphere—such as may arise from wind-blown sand and smoke—and from water and like fluids, including during full immersion including at great depths and pressures.

The present invention particularly contemplates a camera which is totally encapsulated, preferably by being cast in plastic, with no seals or penetrating pins, wires or other objects whatsoever. The underwater camera so constructed is absolutely incapable of leaking: it has no holes nor any joints. Nonetheless to being hermetically sealed, the digital camera can be retrieved from its encasement if required or desired.

Furthermore, the present invention particularly contemplates encapsulated digital cameras having no air spaces inside, which can therefore be used at extreme depths.

Still furthermore, the present invention particularly contemplates encapsulated digital cameras with adjustable optics that are immersed in water when the digital camera is placed in water. The optics are thus adjustable without necessity of being placed in a watertight enclosure.

Finally, the present invention particularly contemplates new and improved means of communicating each of (i) information, (ii) electrical power and (iii) control across a water-tight barrier particularly as may encapsulate and protect a digital electronic camera.

1. A Waterproof Digital Electronic Camera System

The present invention contemplates a weatherproof and watertight digital camera that is designed to operate both on land and underwater to great depths. The camera is preferably hermetically sealed, and is thus impervious to contamination both from the atmosphere—such as may arise from wind-blown sand and smoke—and from water and like fluids, including during full immersion including at great depths and pressures.

Nonetheless that the camera is hermetically sealed, its case, and all necessary electrical and digital electrical communication with the camera, are economically manufactured.

The economy of the case results primarily because there are absolutely no passages though the case of the camera, nor are any waterproof fittings employed. Indeed, in one of its embodiments the case of the camera is formed by completely encapsulating the camera, and some modest auxiliary electronics, within a solid block of, preferably, plastic during a potting process.

The economy of communication is because the camera uses standard wireless communication links. Communication of image data from the camera to the exterior of its transparent case is preferably via an optical, and more preferably an infrared optical or RF link.

The watertight digital electronic camera so constructed is further characterized in that communication of an actuation signal to the shutter of the camera is via a magnetic or mechanical-optical coupling. In one embodiment a trigger circuit based on a Hall-effect sensor or a Reed relay, and located interior to the sealed case, produces an electrical signal suitable to actuate the camera's existing shutter circuit whenever a small permanent magnet exterior to the case is brought into proximity, normally by manual movement in a simple sliding mechanism in a manner suggestive of a standard shutter release.

The watertight digital electronic camera so constructed is still further characterized in that the camera has, quite conventionally, a rechargeable source of power, normally a battery. This rechargeable power source is, however, recharged quite unconventionally via an inductive coupling. In the preferred embodiment an oscillating, alternating current (a.c.), electromagnetic field external to the case is inductively coupled into (i) an inductive coil internal to the case. Also internal to the case, (ii) a bridge rectifier rectifies the alternating current induced in the inductive coil to produce a direct current, and (iii) a regulating and charging circuit conditions this direct current into power to charge the rechargeable power source.

As a still further major aspect of the present invention, the case—which is normally formed quite snug to the camera and its auxiliary electronic circuits—may be filled with an optically-transparent electrically-dielectric liquid. The case may even be formed by potting: solidifying a liquid polymer that extends into all regions and volumes of the case—including inside the camera—into a solid block of optically-transparent electrically-dielectric plastic. This construction, which leaves the enclosed volume of the case substantially entirely devoid of gas, permits that the waterproof camera may be used at great depths of at least a mile, and may be non-destructively subjected to correspondingly great hydrostatic pressures. Any necessary preset to the lens system of the camera to account for the differing indexes of refraction of air and of the potting plastic is contemplated.

2. An Underwater Digital Electronic Camera System

Therefore, in one of its aspects the present invention will be recognized to be embodied in a waterproof digital electronic camera system. The system includes (i) a digital electronic camera, and (ii) a converter, within (iii) an enclosure.

The (i) digital electronic camera has a digital electrical signal interface for downloading image information from the camera.

The (ii) converter converts signals upon the digital electrical signal interface to optical or, preferably, RF signals.

The (iii) enclosure hermetically seals water and air tight both (i) the digital electronic camera and (ii) the converter. The enclosure is transparent in at least an area of lens of the digital electronic camera so that pictures may be taken through the enclosure, and so that any optical signal output of the converter so that optical signals containing image information are communicable exterior to the camera. Note that if an RF link is used to retrieve data from the camera, then the casing need not be optically transparent for this communication. The case will, however, be substantially transparent to radio frequency energy.

The (i) digital electronic camera typically has a serial digital electrical signal interface, and most commonly an RS-232 or USB interface, thus making that (ii) the converter is converting signals upon the serial digital electrical signal interface to serial optical signals. The preferred converter in particular includes (i) an RS-232 or USB to TTL signal converter converting RS-232, USB, or other serial digital electrical signals to Transistor-Transistor Logic (TTL) serial digital electrical signals, (ii) an encoder-decoder converting the TTL electrical signals to electrical signals that are suitably encoded so as to be converted to optical or radio signals for further transmission, and (iii) an electrical-to-optical signal converter converting the encoded electrical signals to optical or radio signals, and transmitting the optical or radio signals through the enclosure.

Particularly in the case of an RF link, digital signals from the camera may be converted to RF signals through a digital RF modem, a device well familiar to practitioners of the art of communications engineering.

Further in the preferred system of the invention, the digital electronic camera conventionally has a shutter circuit for activating the shutter, to which shutter circuit electrical connection may suitably be made. This shutter circuit is preferably connected to a trigger circuit exterior to the digital camera but within the enclosure. The shutter circuit serves to take some stimulus external to the enclosure and to produce responsively thereto an electrical signal which, when and as supplied to the shutter circuit, will activate the shutter of the digital electronic camera.

The trigger circuit may be implemented in several different variants. A Hall-effect sensor responsive to a magnetic field can be used to produce a signal output, with an amplifier amplifying this signal output for application to the shutter circuit as the electrical signal responsively to which the shutter circuit will activate the shutter of the digital electronic camera. Triggering of the Hall-effect sensor may be realized by the simple expedient of manually moving a permanent magnet, external to the enclosure, into physical proximity to the Hall-effect sensor that is within the enclosure.

Alternatively, the trigger circuit may be based on a Reed relay sensor which is also responsive to a magnetic field to produce the electrical signal responsively to which the shutter circuit will activate the shutter of the digital electronic camera.

Still further, the trigger and other control circuits may be controlled via a mechanical-optical coupling which also does not require penetration of the enclosure. An LED and a photo sensor device are placed on each side of a hole in the enclosure that has optically clear material to at least two opposed sides. When the camera operator's finger or other obstruction, such as the plunger of a switch, is placed in the hole of the enclosure and between its opposed sides, then an optical link is interrupted which, after some simple circuitry, results in an electrical signal being sent to the camera to control the shutter or effect some other desired control.

Still further in the preferred system of the invention, the digital electronic camera has, as is conventional, a rechargeable power source, normally a battery, for providing power to at least (i) the digital electronic camera and also, in the case of the system of the invention, (ii) a signal converter which is external to the camera but still within the enclosure. The overall system preferably then further includes a charging circuit, exterior to the camera but within the enclosure, for converting some stimulus external to the enclosure into power suitable to recharge the rechargeable power source. The stimulus is preferably an oscillating, alternating current (a.c.), electromagnetic field. Accordingly, the preferred charging circuit includes (i) an inductive coil in which alternating current is induced by an oscillatory magnetic field external to the enclosure, (ii) a bridge rectifier rectifying the alternating current of the inductive coil to produce a direct current, and (iii) a regulating and charging circuit conditioning the direct current into power to charge the rechargeable power source.

The enclosure of the digital electronic camera and its associated auxiliary electronics is structurally simple and inexpensive, but functionally sophisticated. In one preferred variant the camera and the converter (and any other incorporated features such as the trigger circuit and/or the charging circuit) are entirely potted in an optically clear dielectric material. This optically clear dielectric potting material is preferably drawn from the group consisting essentially of plastic and hydrocarbon liquids, such as polycarbonate plastic, and is more preferably an epoxy resin or silicone encapsulant.

In a first variant of this potting, discussed further in section 3, below, the potting may extend into the interior volumes of the camera (and anything else, such as the inductive coil), so that, ultimately, the enclosure contains only solid masses, and is devoid of any gas whatsoever. In another, second, variant the (potted, or otherwise sealed) enclosure contains both solid and liquid masses, only, and there is still essentially no gas whatsoever within the enclosure nor within the camera that is within the enclosure. In this variant the liquid is an optically clear dielectric, and thus interferes with neither the optical functions of the camera nor the electrical functions of the camera and of the converter. In a final variant the potting covers the image detector—such as a CCD—of the camera, but an adjustable lens assembly of the camera remains outside the potted enclosure. In this case the lens becomes surrounded with water when the camera is immersed in water.

3. An Encapsulated Waterproof Digital Electronic Camera System

Therefore, in another of its aspects the present invention will be recognized to be embodied in a waterproof digital electronic camera where the optics and electronics of the camera are permanently within a solid mass of optically clear dielectric material, and where the camera contains essentially no gases whatsoever. By this construction the camera may suitably be immersed to great depth within the ocean without crushing.

In one variant of construction the digital electronic camera is potted inside and out to be within a solid block of optically clear dielectric material, preferably plastic and more preferably clear epoxy resin such as Master Bond EP37-3LV.

In another variant of construction, all the camera electronics including power, switch controls, and electronic imager, are cast in clear plastic. However, the lenses which focus the image onto the imager are immersed in, and focus through, the surrounding water.

In another variant of construction the digital electronic camera is within an optically clear liquid dielectric material, the camera and its liquid being held within a liquid-tight exterior case that is itself optically clear in at least a region where an image is received through the case and into a lens of the camera. The preferred liquid is a liquid hydrocarbon, and is more preferably ethanol.

In another variant of construction the digital electronic camera is within a block of clear yet flexible potting material which can be cut with a knife. Such a material would provide a hermetic seal and also allow the camera to be retrieved for repair or replacement. The preferred encapsulant is Master Bond Mastersil 151 (or similar silicone) encapsulant or Master Bond EP30D or similar polymer encapsulant.

4. An Underwater Watch

As a further extension of the broad concepts of the present invention a completely sealed underwater watch can be made by encasing a digital watch, including its electronics and battery, inside a clear plastic slab. The settings of the watch can be changed using the hall-effect magnetic proximity switches described above. The watch battery can also be recharged as previously described for the waterproof digital electronic camera.

Alternatively, the watch can simply be fitted with a single battery which will last for several years; the life of the watch. (An optional photovoltaic array permits recharging.) The watch is economical yet operable at great depths and pressures since it is entirely embedded in plastic and there are no air spaces inside.

These and other aspects and attributes of the present invention will become increasingly clear upon reference to the following drawings and accompanying specification.

BRIEF DESCRIPTION OF THE DRAWINGS

Referring particularly to the drawings for the purpose of illustration only and not to limit the scope of the invention in any way, these illustrations follow:

FIG. 12 is a cross-sectional plan diagram of another embodiment of this invention in which components of a digital electronic camera are embedded in a block of dielectric potting material, the battery is embedded in a chamber of semi-rigid encapsulant, the lens is contained within a chamber of dry air, and connections for downloading and recharging are made via a through the wall connector.

DETAILED DESCRIPTION OF THE PREFERRED EMBODIMENT

Although specific embodiments of the invention will now be described with reference to the drawings, it should be understood that such embodiments are by way of example only and are merely illustrative of but a small number of the many possible specific embodiments to which the principles of the invention may be applied. Various changes and modifications obvious to one skilled in the art to which the invention pertains are deemed to be within the spirit, scope and contemplation of the invention as further defined in the appended claims.

The present invention is embodied in an underwater electronic digital camera which never needs to be opened except perhaps, optionally, for replacement of a rechargeable battery. Even this apparent limitation to, and difficulty in, preserving the watertight integrity of the camera has a solution which will be described below.

1. The Housing

Figure 1:
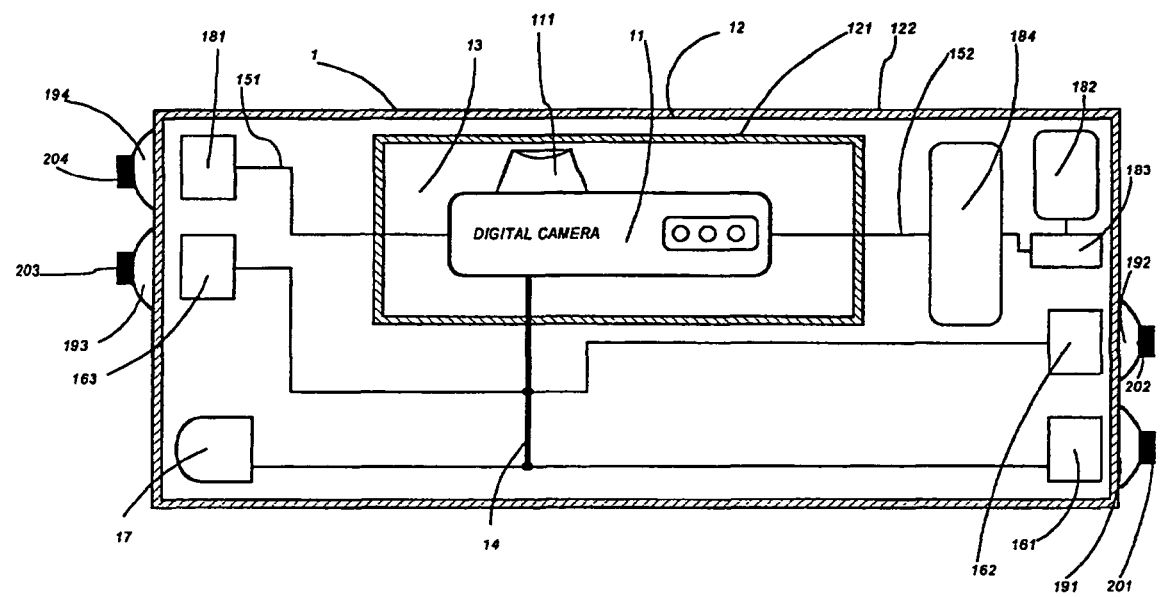
FIG. 1 is a cross-sectional top plan view of a first, air-filled, preferred embodiment of a waterproof digital electronic camera system according to the present invention.

A cross-sectional top plan view of a first, air-filled, preferred embodiment of a waterproof digital electronic camera system 1 according to the present invention is shown in FIG. 1. An entire digital electronic camera 11, including its optics 111, are contained within a waterproof case, or housing, 12. The housing 12 is preferably constructed of two plastic encasings 121 and 122, one fitting inside the other. The smaller inner encasing 121 is fitted over the camera 11 and its optics 111, forming a compartment 13. This compartment 13 is filled with air in a first variant embodiment of the camera system 1 and its housing 12, and with fluid or solid, polymerized, plastic in a second variant embodiment of the camera system 1 and its housing 12.

Control wires 14 and (2) power wires 151, 152 connect the camera 11 through holes in the inner housing 121 respectively to (1) switches 161-163 and infrared (IR) PC interface link 17, (2) a power switch 181, and (iii) a battery 184 (itself connected to recharging circuit 183 and charging coil 182). Clear plastic resin is poured into the space interior to the outer housing 122 but exterior to the inner housing 121. This forms an economical yet hermetic housing capable of withstanding high underwater pressures at depths in excess of 500 feet.

A mass-produced version may be fabricated as a single casting of polycarbonate, Lucite$^{SM}$ plastic (Lucite is a trademark of Rohm & Haas, Inc.), or clear epoxy. The inner air compartment then consists of a thin-walled clear plastic box 121 embedded in a solid potting, or casting, which holds the optics 111 of the camera 11 aligned in the air compartment until the plastic cures.

Figure 10:
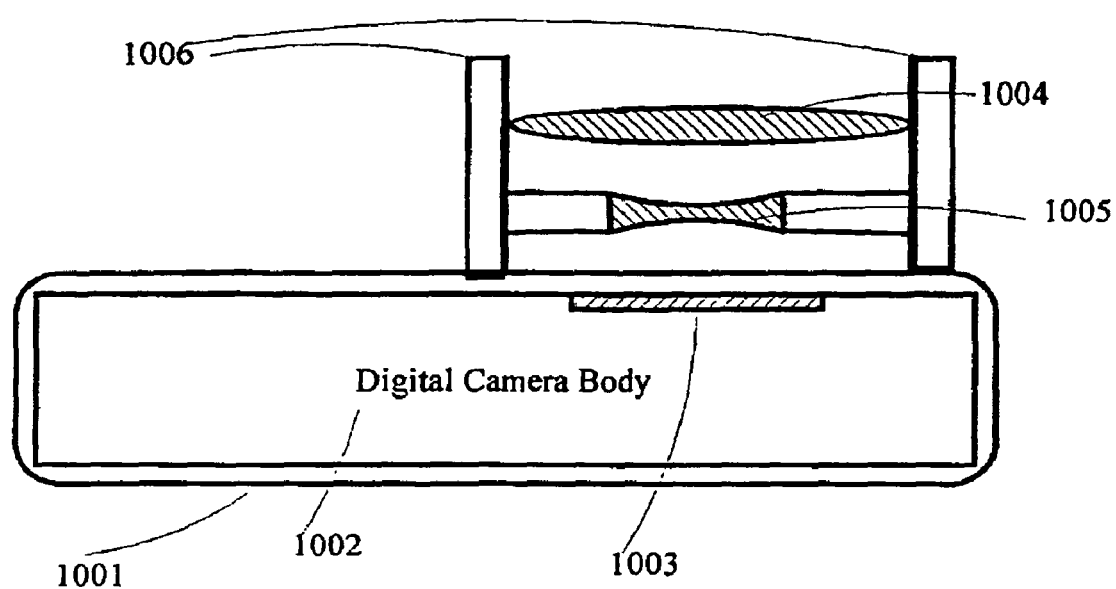
FIG. 10 is a cross-sectional top plan view of an additional embodiment of the camera which is wholly potted in clear plastic, and which has lenses which are external and focus through the water in which the camera is operating.

A variation of this embodiment consists of encasing the camera electronics in clear plastic, while the optics remain external and immersed in liquid. This embodiment is shown in FIG. 10 and will be described in a later section.

Another variation of this embodiment would consist of casting the camera in an encapsulant which is clear, yet is soft enough that it can be cut should it be necessary to remove or service the camera. Master Bond Mastersil material 151 is ideal for this application, with both excellent optical clarity and tough yet flexible consistency. This embodiment also provides resistance to vibration and shock for the camera components. Since the encapsulant is flexible, the outer housing 12 should be hard to provide resistance to pressure. The encapsulant still provides the optically-clear, hermetically-sealed, boundary.

2. The Switches

Switches 161-163, 181 in the form of Reed relay proximity switches or Hall-effect devices are placed near the outer wall of the outer housing 122. To the outside of the housing 122, small rubber beads 191-194, each with an associated magnet 201-204 mounted on its outer surface, are placed near each proximity switch 161-163, 181. By depressing the rubber beads 191-194 with the fingers the associated magnets 201-204 are brought closer to the associated switch, activating the switches 161-163, 181. As may later best be understood by reference to the partial schematics of FIGS. 3-5, this magnetic switching may alternatively be accomplished by Hall Effect semiconductor switches (at least in the locations of switches 161-163)—which also results in a more sensitive switch design.

Hall-effect semiconductors also have the advantage of no moving parts without any requirement for such gas space—required by the Reed relays—as may hinder use of the camera at great depth and pressure. However, for the gating of main power (see the pictorial partial schematic of FIG. 4) a reed switch is superior since there will not be any leakage current. The main power switch 181 is unlike the other switches 161-163 in that a latching mechanism must be provided. A simple sliding element as is diagrammatically illustrated in FIG. 4, or, alternatively, a sideswipe lever (not shown), entirely fabricated from plastic can work to selectively emplace a magnet, normally embedded inside the manually slidable or otherwise movable part, into proximity with, or separation from, the switch 181.

Figure 2:
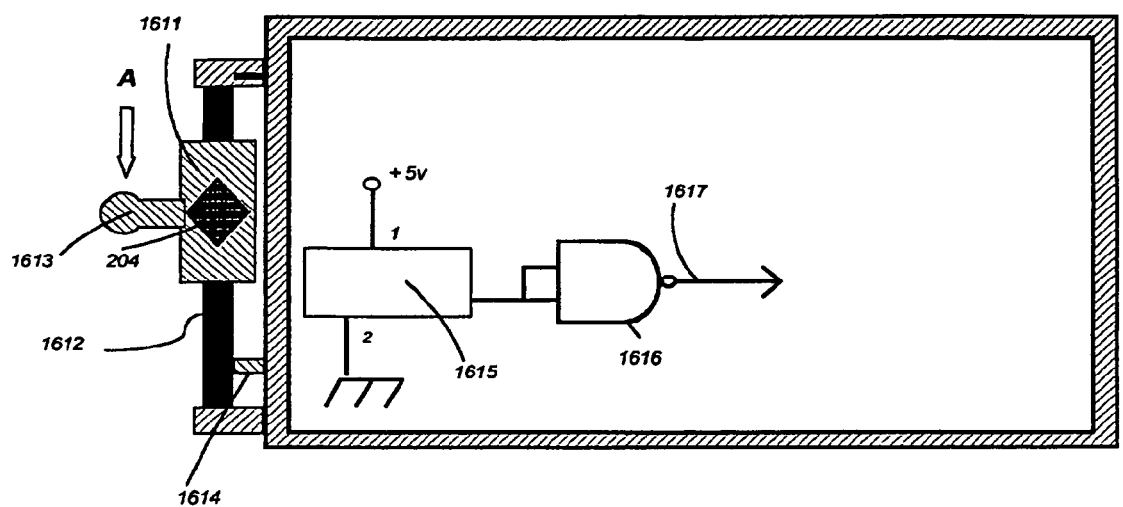
FIG. 2 is a combination electrical and mechanical detail schematic diagram of the preferred embodiment of a waterproof digital electronic camera system according to the present invention, previously seen in FIG. 1, particularly showing a preferred shutter actuation interface.

A preferred variant of any of the switches 161-163 (shown in FIG. 1) is shown in detail in the combination electrical and mechanical schematic block diagram of FIG. 2.

The first variant preferred shutter actuation interface includes a magnet 201 mounted on slide switch 1611 having a sliding lever 1613 and retained in the illustrated position by elastic bands, or plastic springs, 1612. Pressing with the fingers on the lever 1613 in the direction of vector A moves the side switch into the stop 1614, positioning magnet 204 proximate to Hall effect sensor 1615 and producing an electrical signal which, as amplified in amplifier 1616, suffices to trigger the shutter of the camera 11 (not shown in FIG. 2, shown in FIG. 1) electrically connected to wire 1617. The Hall effect sensor 1615 is preferably Micronics type HAL 1145VA. The amplifier 1616 is preferably industry standard part number 7400.

The switch 181, which controls the application of power from the battery 184 to the camera 11, will be more particularly discussed in following section 4.

3. The Data Interface

Figure 3:
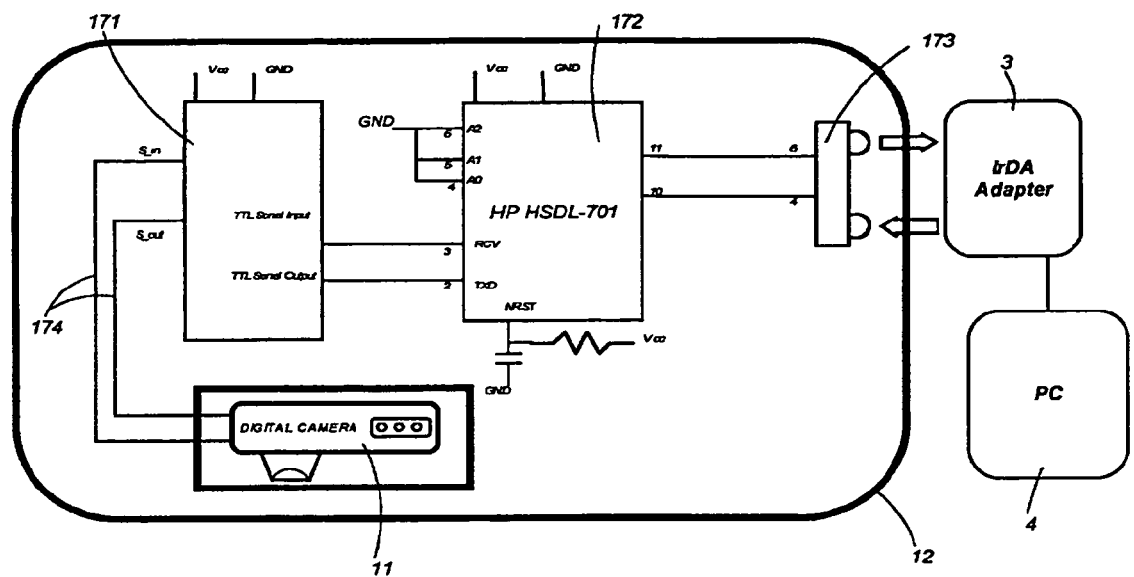
FIG. 3 is a combination electrical and mechanical schematic diagram of a preferred embodiment of a waterproof digital electronic camera system according to the present invention, previously seen in FIGS. 1 and 2, particularly showing a preferred optical-link data interface.
Figure 4:
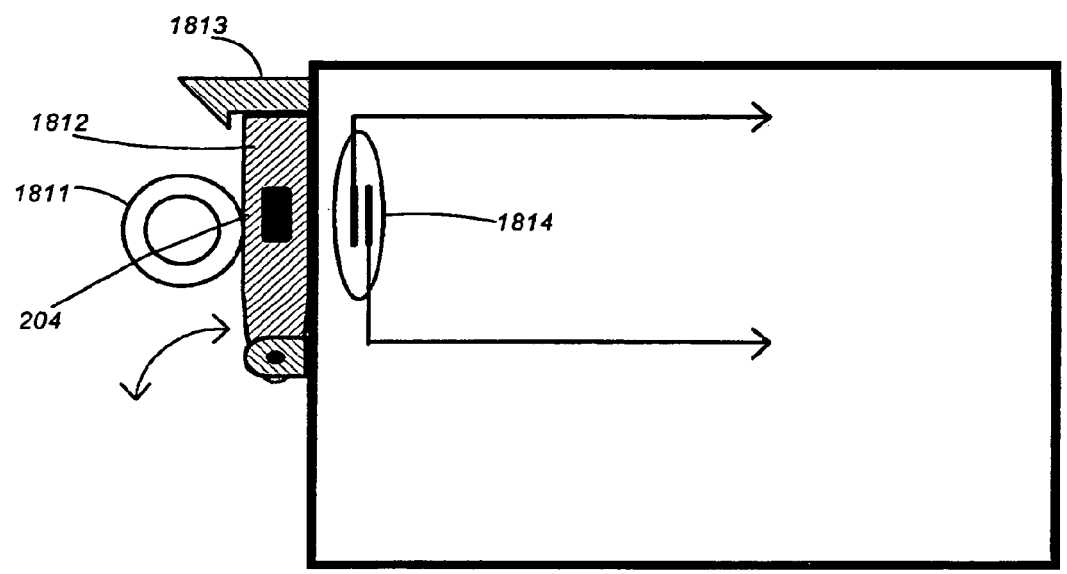
FIG. 4 is a combination electrical and mechanical detail schematic diagram of the preferred embodiment of a waterproof digital electronic camera system according to the present invention, previously seen in FIGS. 1 through 3, particularly showing a preferred power switch interface.

The data interface of the waterproof digital electronic camera system of the present invention, for example an infrared serial personal computer interface including the infrared (IR) PC interface link 17 shown in FIG. 1, is illustrated in the combined schematic and diagram of FIG. 3.

The preferred PC interface takes place through an infrared (IR) PC interface link 17 consisting of an RS-232C to TTL converter 171, an encoder-decoder 172 and an infrared IrDa compliant transceiver 173. It receives serial data in the RS-232C interface format upon two 115,200 bit per second (bps) signal lines 174 from the digital electronic camera 11.

Then encoder-decoder 172 is preferably Hewlett-Packard type HSDL-7001. The infrared IrDa compliant transceiver is preferably Hewlett-Packard type USDL-1001. Together these components transmit the data received from the digital electronic camera 11 upon a digital optical, and more particularly an IrDA-compliant infrared, link.

These infrared pulses are detected by an IrDA adapter 3 to a personal computer (PC) 4. The preferred IrDA adapter 3 is the "Jeteye IrDA adapter" available from Extended Systems, Inc. This component converts the received infrared pulses back into an electrical RS-232C, interface format.

Accordingly, in the present invention electrical data signals from the digital electronic camera 11 are translated into optical pulses in the IR spectrum and passed through the transparent wall of the camera's housing 12 to an integrated IR detector and signal converter, or IrDa Adapter 3, on the other side. The IR interface can easily handle the bandwidth required for data transmission in accordance with the RS-232C interface standard, even at high baud rates. The entire process is opaque to both (i) the digital electronic camera 11 and the firmware operating therein, and to (ii) the PC 4 and the software operating therein.

Figure 8:
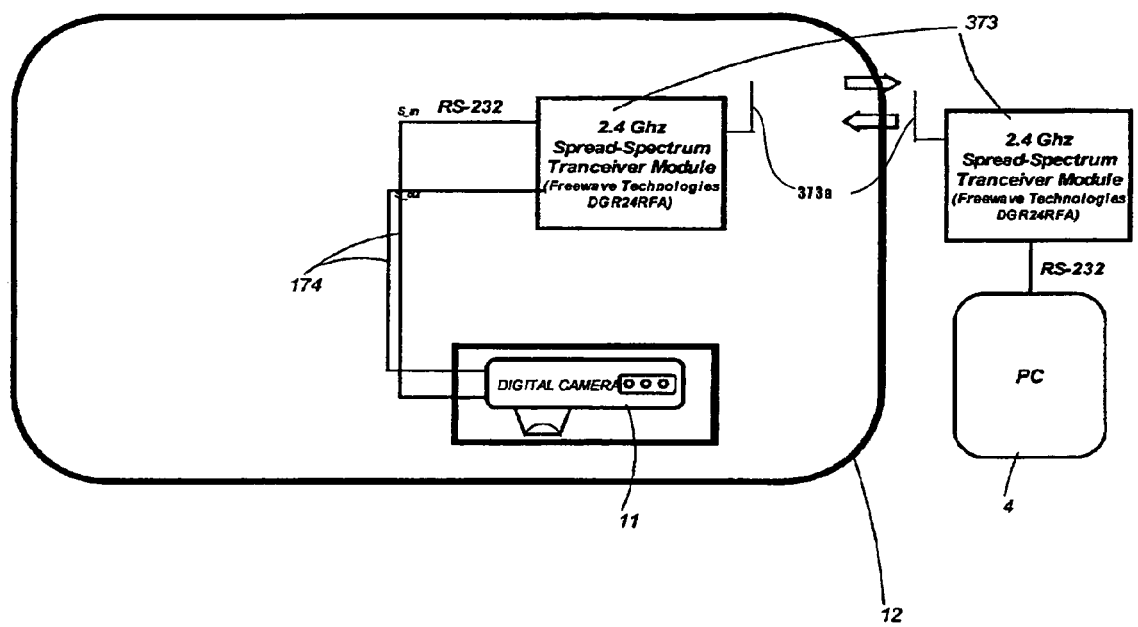
FIG. 8 is a picture of an embodiment of a waterproof digital electronic camera system according to the present invention, previously seen in FIGS. 1 through 5, that employs an RF data link to retrieve images from the camera.

In FIG. 8, an equivalent link is shown using a preferred radio frequency (RF) link for the purpose of communicating the image data to a PC or other device outside the camera. The signals from the camera—nominally in accordance with the RS-232 or Universal Serial Bus (USB) interface standards—are input to an imbedded RF communications device (373) which has been designed to convert RS-232 (or, alternatively, USB) data streams for transmission and reception over RF. The Freewave Technologies DGR24RFA is an example of an off-the shelf module that could be used for this purpose. However, many more digital RF modem devices, such as those supporting the Bluetooth standard, could be used at a variety of frequencies for this purpose.

The basic principal of the present invention that (i) signals from the camera can be converted to modulated radio frequency (RF) signals, fed to an antenna 373*a* and that (ii) these RF signals will traverse the camera casting without the need for penetrating wires which are prone to leakage, is the same no matter what particular (i) camera, and (ii) wireless digital transmission standards, and protocols, are involved. A practitioner of the wired and wireless digital communication arts will recognize that the present invention may be realized with many different (i) wired and (ii) wireless communications standards, and that many suitable standards are presently (circa 2000) implemented in semiconductor chips or chip sets, and are not difficult of use in the underwater camera system of the present invention.

4. The Power Switch

The preferred power actuation interface shown in FIG. 4 again uses a magnet 204, now mounted on toggle switch 1811 having a swing arm 1812 retained in the illustrated position by a latch 1813. Moving under force of the fingers, the magnet 204 proximate to the Reed relay switch 181 closes this Reed relay 1814, gating power through the path thereby established from the battery 184 to the camera 11 (both shown in FIG. 1).

5. The Recharging Interface

A charging coil 182—preferably with a ferrite core (as will be more particularly illustrated in FIGS. 6, 7, and 9)—is located inside the plastic outer housing 122. This charging coil connects to a charging circuit 183 and through this circuit to a battery 184.

When the battery 184 is to be recharged, another coil carrying an alternating current (not shown in FIG. 1, shown in FIGS. 6 and 7) is placed outside the other housing 121 proximately to the charging coil 182, and is aligned to induce current in this internal charging coil 182. The outer coil acts as the primary winding of a transformer while the inner, charging, coil 182 acts as the secondary. The alternating current inductively induced in the inner (secondary) charging coil 182 is then rectified, filtered and regulated in the charging circuit 182 and applied as a d.c. current to charge the battery 184. In this way the battery 184 can be charged without any need for opening the housing 122, or even for having any wires to penetrate the housing 122. The battery 184 is charged and recharged entirely while it is continuously within the plastic housing 122.

Figure 5:
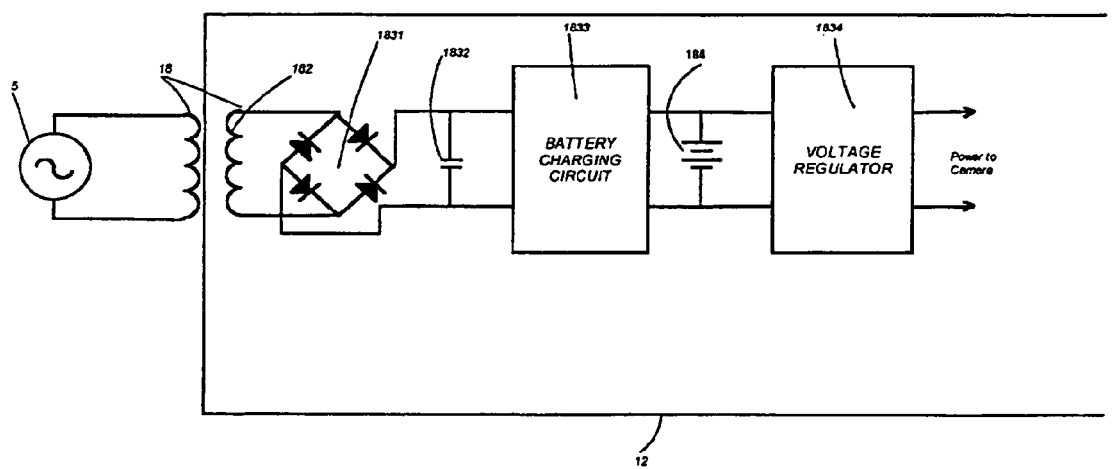
FIG. 5 is a combination electrical and mechanical detail schematic diagram of the preferred embodiment of a waterproof digital electronic camera system according to the present invention, previously seen in FIGS. 1 through 4, particularly showing a preferred recharging interface.

A detail combination electrical and mechanical schematic block diagram of the preferred embodiment of the recharging circuitry for the waterproof digital electronic camera system according to the present invention, previously seen in FIGS. 1 through 4, is shown in FIG. 5. An external source of a.c. power 5 is inductively coupled through transformer 18, the secondary winding of which is the charging coil 182 located inside the housing 12 (shown in FIG. 1). The a.c. current induced in the charging coil 182 (a transformer winding) is communicated to rectifier 1831, normally a simple diode bridge, and filtered as a d.c. voltage in capacitor 1832. The d.c. voltage and current is conditioned in battery charging circuit 1833 and applied to charge battery 184. Power from the battery 184 may optionally be regulated in voltage regulator 1834 before application to camera 11 (shown in FIG. 1).

Figure 6:
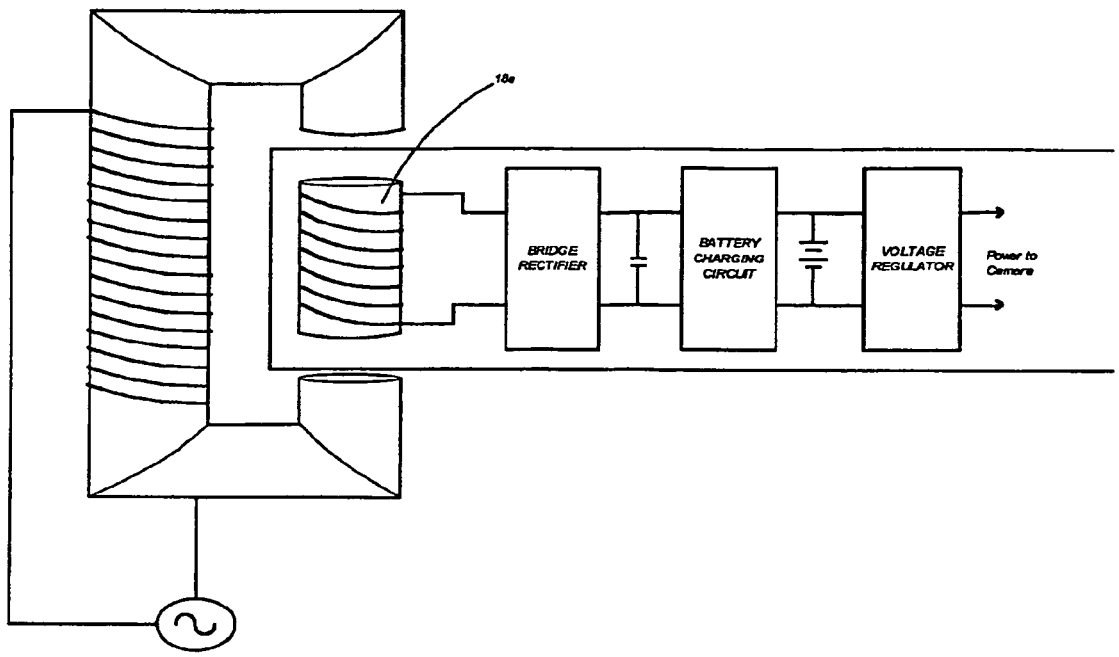
FIG. 6 is a combination electrical and mechanical detail schematic diagram of the preferred embodiment of a waterproof digital electronic camera system according to the present invention, previously seen in FIGS. 1 through 5, particularly showing a first variant of the construction of a transformer within the preferred recharging interface previously seen in FIG. 5.
Figure 7:
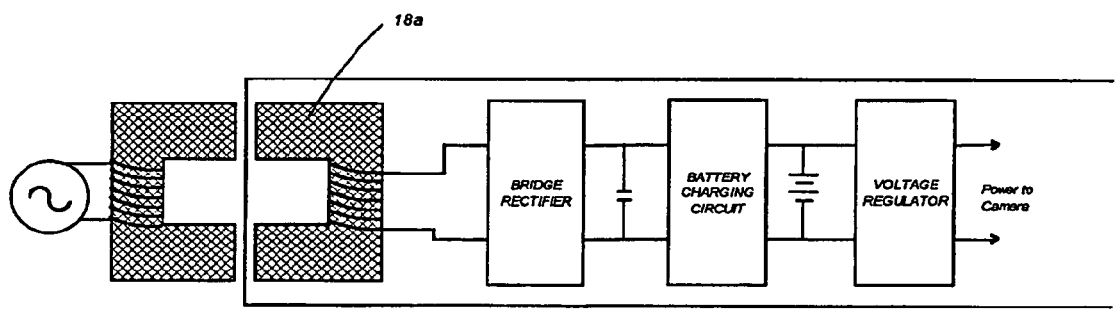
FIG. 7 is a combination electrical and mechanical detail schematic diagram of the preferred embodiment of a waterproof digital electronic camera system according to the present invention, previously seen in FIGS. 1 through 5, particularly showing a second variant of the construction of the transformer of the preferred recharging interface previously seen in FIG. 5.

These same components of FIG. 5, now in conjunction with a first, and a second, variant embodiments of the transformer 18, are respectively illustrated in FIGS. 6 and 7. The physical design of the transformer 18*a* of FIG. 6 realizes good inductive coupling between the primary and secondary coils of the transformer because the primary coil is (in terms of the flow of magnetic flux) located across the secondary coil. The transformer 18 configuration requires that the charger for the camera—which is, of course, normally used only when the camera is not in use for imaging—have a greater thickness than does the camera, which some users may find objectionable. Although the primary coil is still, in terms of the flow of magnetic flux, located across the secondary coil in the variant embodiment of FIG. 7, the primary and secondary windings of the transformer 18 are of equal thickness, and the charger for the camera 11 may be as thin as is the camera itself.

Figure 9:
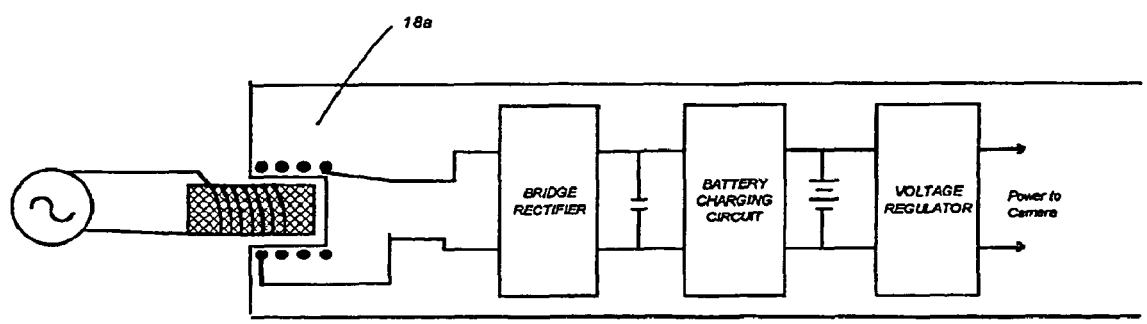
FIG. 9 is a combination electrical and mechanical detail schematic diagram of the preferred embodiment of a waterproof digital electronic camera system according to the present invention, previously seen in FIGS. 1 through 5, particularly showing a third variant of the construction of the transformer of the preferred recharging interface previously seen in FIG. 5 where a ferrite or iron core is only required in the part of the charging circuit outside of the camera, thus reducing the weight of the camera itself.

FIG. 9 is a combination electrical and mechanical detail schematic diagram of the preferred embodiment of a waterproof digital electronic camera system according to the present invention, previously seen in FIGS. 1 through 5, particularly showing a third variant of the construction of the transformer of the preferred recharging interface previously seen in FIG. 5 where a ferrite or iron core is only required in the part of the charging circuit outside of the camera, thus reducing the weight of the camera itself. This configuration also offers a more efficient transfer of energy since the primary and secondary windings are concentrically wound around the same core when the core is inserted into the indentation as shown in FIG. 9.

In this most preferred embodiment of FIG. 9 the primary and secondary of the transformer are both wound around the same core.

A single piece of ferrite or other ferrous core material is located on the primary and inserted into a hole in the camera during charging. Thus the ferrite or iron core is only required in the part of the charging circuit outside of the camera, beneficially reducing the weight of the camera itself. Compared to the other configurations shown, this embodiment offers more efficient transfer of energy from the primary located outside the camera to the secondary windings inside the camera casting.

6. A Solidly Encapsulated Embodiment

An alternative second embodiment of the hermetically sealed digital electronic camera in accordance with the present invention is essentially the same as the first embodiment with one important difference: the entire camera including both the camera electronic and optics are cast into clear casting resin or other clear plastic.

The optics may be constrained to be immovable, and thus focus free. These focus free optics may be preset, or, in extreme cases, custom designed by aid of standard ray-tracing lens design programs that accord consideration to the indices of refraction of all media in the optical path, so as to correctly accommodate the index of refraction of the clear plastic medium which is, of course, different than that of air. However, the optics may alternatively be moveable (such as to focus), and located outside the encapsulated enclosure of the camera, as explained in section 6.3 below.

The solidly encapsulated design offers the advantage of easy manufacture while permitting camera operation to virtually any depth under water because, with no airspace within the camera, there is no pressure differential between the outside and the inside of the camera. Like the more rudimentary hermetic sealing of the camera with some gas still inside, the second embodiment is enabled by the fact that the camera never needs to be opened during all phases of operation.

6.1 A Fluid-Filled Housing Variation on the Second Embodiment

A variation on the second embodiment of the invention employs a housing that is fluid-filled, or that is at least in part fluid filled. The preferred fluids are clear dielectrics. Both common mineral oil and synthetic gel suffice. However, if the fluid is present in the optical path, fluids with high optical clarity are preferred. These fluids are associated with fluid-filled optical light pipes, and may readily be located in, inter alia, the patent literature on this precise subject.

Note that certain fluids transmit better in certain regions of the optical spectrum. Clearly any fluid in the optical path of the digital camera should be chosen in consideration of the frequency of the images desired to be registered by the camera. For example, the electronic sensor array plane of the camera need not be a Charge Coupled Device (CCD) targeted on visible light, but may instead be an active pixel array sensitive, in the manner of the common use of these arrays in telescopes, to infrared light. Clearly if the digital electronic camera is to capture images in infrared light, any liquid (or solid) in the optical path would be highly transparent to light of this frequency.

The housing is closed around the fluid or gel, and experiences zero pressure differential. Yet the camera electronics are protected. This variant embodiment has the advantage that housing could be opened and the camera electronics removed for servicing. Also, in the event that the camera optics must move, such as to focus, the fluid or gel can accommodate this.

6.2 A Semi-Rigid Encapsulant Variation on the Second Embodiment

Another variation to the second embodiment consists of casting the camera, including optics, in an encapsulant which is clear, yet is soft and flexible enough so that it can be cut should it be necessary to remove or service the camera. Master Bond Mastersil 151 is ideal for this application, with both excellent optical clarity and tough yet flexible consistency.

This variant embodiment also provides resistance to vibration and shock for the camera components. Since the encapsulant is flexible, it should be provided with some outer hard shell to provide durability. In this case, however, the optics could not be adjusted so they must be capable of focus-free operation. The optics would need to be redesigned to account for the index of refraction of the encapsulant.

6.3 A Solidly Encapsulated Variant Embodiment Having Optics External to the Enclosure, and Immersed when the Encapsulated Camera is in Water A third embodiment is shown in FIG. 10. In this third variant embodiment the electronic digital camera electronics 1002, including the electronic imager device 1003, are cast in hard plastic 1001 with no air spaces—as in the second embodiment. But here the optics 1004 1005 are located outside the casting, being immersed in the external water environment.

This embodiment offers the advantage of zero pressure differential in the camera's optics, yet these optics can move to allow focus and zoom by mechanical movement in a cylinder 1006 in a manner functionally identical to the lens mounting and movement of a land (air) camera.

In this third variant embodiment the optics need to be designed to focus through water rather than air. This is readily accomplished with modern computerized optical design programs, which accord for assigning an index of refraction to all media in which light travels.

The third variant embodiment is substantially incapable of leakage at any depth while supporting both focusing and zooming. The zero-pressure differential allows fabrication to be small since the encapsulant and housing do not have to withstand deformation due to water pressure.

7. An Underwater Camera with a Variant Mechanical-Optical Switch

Figure 11:
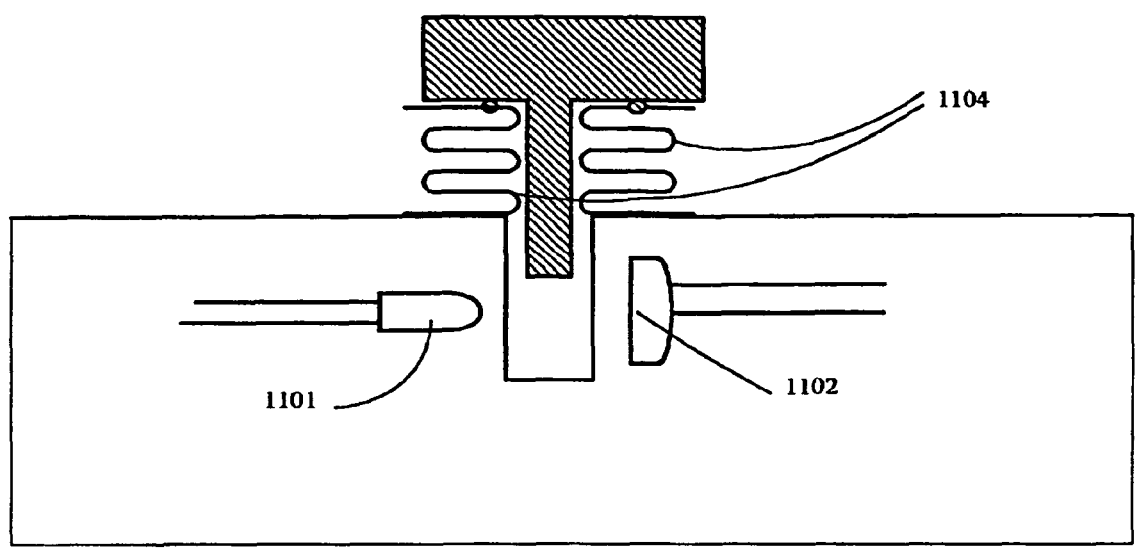
FIG. 11 is a combination electrical and mechanical detail schematic diagram of an optical switch that is an alternative to the magnetic switches previously shown for control of the camera.

An variant optical switch design, usable on the underwater camera system of the present invention, is shown in FIG. 11. Like the magnetic design, there are no penetrations of the clear, cast, enclosure of the camera.

However, the difference is that an optical coupling is used rather than magnets. The plunger 1104 is depressed (or alternatively the operator's finger is inserted in the hole) which then interrupts the light beam normally existing between the LED 1101 and the photo sensor 1102. The output current of the photo sensor 1102 then drops. This current drop is translated into the desired control signal by simple electronics familiar to engineers versed in the art of digital electronic design.

This variant embodiment of the camera system has the advantage that no magnets are needed and accidental placement in an external magnetic field will not inadvertently activate the controls. The LED and photo sensor pair may operate in the visible light or, preferably, in the infrared portion of the spectrum to reduce potential interference.

8. Optional Replacement of the Rechargeable Battery

Any replacement of the rechargeable battery 184 which may at some point become necessary may, in accordance with the present invention, optionally be made possible by having a battery compartment located near the outside of the housing. The battery 184 is installed in a suitable battery holder and then this sub-compartment is filled with, preferably, a semi-rigid plastic encapsulant (Master Bond EP30DP) which provides a hermetic seal around the battery 184 and all wires and contacts and has good adhesion properties. When the battery 184 is to be replaced, the semi-rigid encapsulant is cut away with a small knife and the battery 184 replaced. Upon replacement of the battery 184, the battery compartment is then refilled with the same encapsulant.

9. Gas-Filled, and Solid- or Liquid-Filled, Embodiments of the Underwater Electronic Digital Camera In one embodiment of an underwater camera in accordance with the present invention, the optics of the camera, or the entire camera, is encapsulated within an air compartment within the camera housing. This design has the advantage that the camera optics do not need to be redesigned for atmospherically-based usage, but the disadvantage is that there will be a pressure differential between the outside water pressure and lower gas (air) pressure inside the compartment, which will, at some depth, become a limiting factor in the design. However, even this design is operable at depths exceeding five hundred feet (500') with the use of only inexpensive plastic materials because the housing is made from a single piece of cast plastic with no openings or seals. There is thus no problem with leakage which exists with conventional O-ring seal designs for underwater cameras.

In another embodiment of an underwater camera in accordance with the present invention, the entire camera is embedded in an optically clear plastic potting material (such as polycarbonate), including, most notably, the (focus-free) optics of the camera. When the camera is delivered into use this potting plastic is solid, and permanent. In a variant of this embodiment the camera, and more normally the camera and the entire interior of the watertight case within which it and any accompanying auxiliary electronics are housed, is filled with a clear liquid, normally ethanol.

This embodiment, and both these variants, have the disadvantage that the camera optics have to be designed for the different index of refraction of the clear plastic potting material, or the liquid, as opposed to air. Also, if the potting plastic solidifies hard (which is normal), then there cannot be any moving parts, making that the camera optics have to be focus-free, and unmoving. When the camera enclosure is filled with a clear, dielectric, fluid, mechanical focusing of the camera optics is still permitted. However, care has to be taken that (1) the immersion fluid is not normally a satisfactory lubricant, (2) material from the camera may become dissolved and/or dispersed in the fluid, clouding its clarity and interfering with photography, and/or (3), depending upon the differential compressibility of the immersion fluid versus water, the fluid may still slightly compress and the camera body distort at very great depths, normally a mile or more. The advantage of the second embodiment is that an inexpensively housed and adapted conventional digital electronic camera can be made to be operable at essentially any depth. This is because a total absence of air inside the camera housing precludes that any pressure differential should arise between the outside and the inside of the camera. The fact that this can be achieved with an inexpensive design makes this embodiment of an underwater camera in accordance with the present invention particularly novel and attractive.

The third embodiment, shown in FIG. 10 consists of the electronics and imager chip being totally encapsulated, with the optics being located external to the casting and focusing through water. This embodiment has the advantage of zero pressure differential yet optics that can move to allow focus and zoom.

FIG. 12 is a cross-sectional plan diagram of another embodiment of this invention. Much of the interconnect wiring and some components are not shown for clarity of comprehension. In addition, external activating controls are also not illustrated. The external controls are constructed in accordance with the previous descriptions.

In this embodiment, digital camera is understood to mean the components without the case. The major components that will be discussed are the lens 2001, the charge coupled device 2004, a rechargeable power source or battery 2008, an electronic storage device 2012 for storing pictures taken by the digital electronic camera in digital electronic form, control electronics 2016, a signal interface 2020 for downloading the pictures from the electronic storage device and the flash unit. 2024.

All components 2001, 2004, 2008, 2012, 2016, 2020 and 2024 are enclosed in a block of gas-free dielectric potting material 2030 so that the lens 2001 is positioned normal to one wall of the block. Methods for molding such gas-free blocks of potting material containing components are well known. In this way the components are hermetically sealed water and air tight and the entire invention can be immersed to great depth within the ocean without crushing.

The dielectric potting material 2030 can be any convenient plastic but the preferred materials are cured epoxy resin, cured silicone resin and cured polyurethane resin. The potting material 2030 can be any color but it must be transparent in the area 2034 of the lens 2001 and the area 2038 of the flash 2024 so that pictures may be taken through the enclosure 2030.

Figure 13:
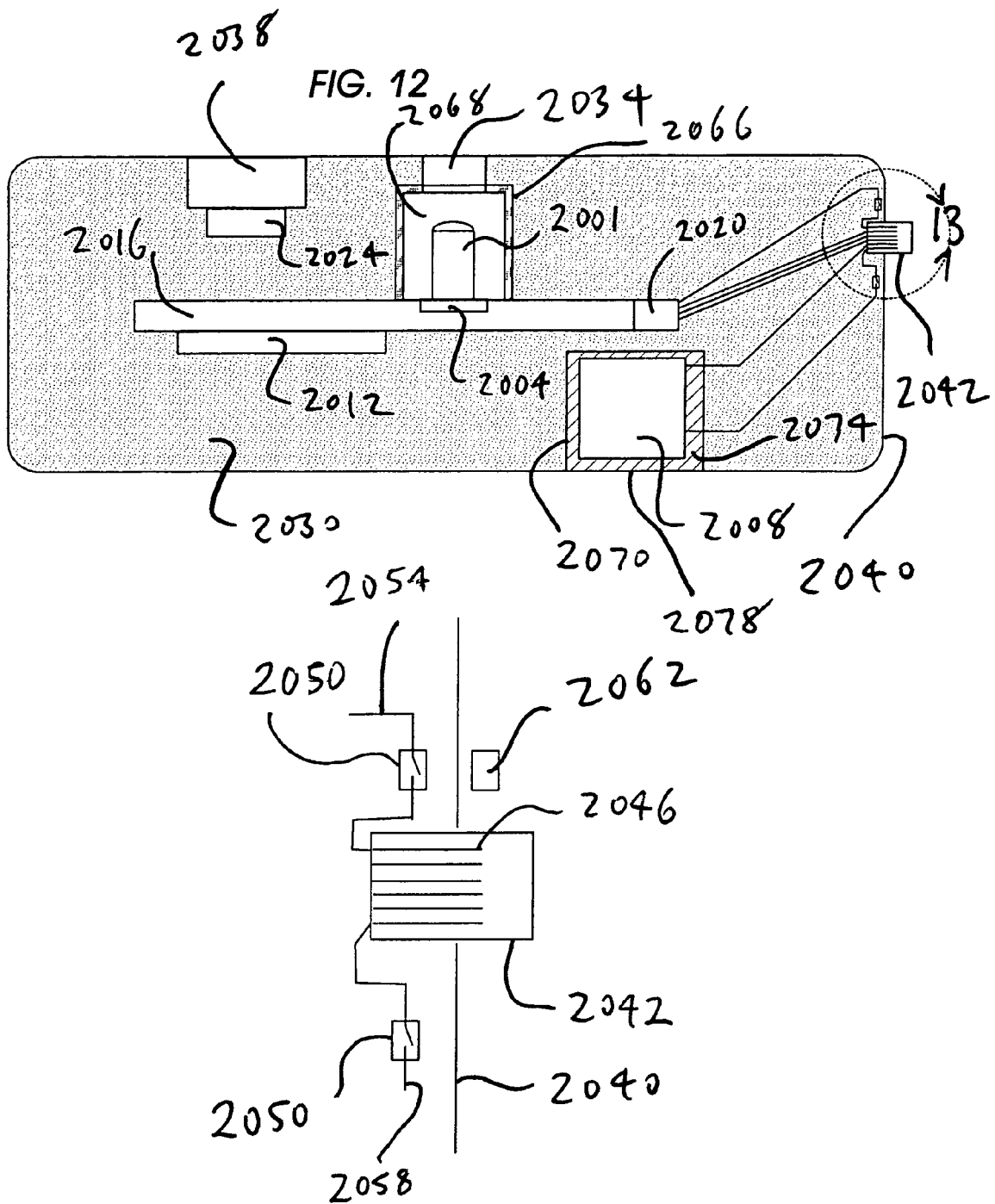
FIG. 13 is an enlarged diagram of the area labeled 13 on FIG. 12 to better illustrate use of normally open magnetic switches in the invention.

This embodiment, similarly to other embodiments, must be able to communicate with devices eternal to the invention for recharging the power source 2008 and downloading the pictures from the storage device 2012 via the signal interface 2020. Preferably, in this embodiment, communication is via a through the wall 2040 connector 2042. See FIG. 13. Preferably, the connector is a male connector with fairly wide spacing between the pins 2046 so that salt water does not become trapped inside the connector 2042. To prevent corrosion of the pins 2046 by salt water, they should be gold plated. To prevent shorting between pins 2046 in salt water a normally open magnetic switch 2050 is included in one connection 2054 to the battery 2008 and in one connection 2058 to the signal interface 2020. The mating female connector contains a magnet 2062 so that the magnetic switches 2050 close and connections can be made for recharging and downloading.

Figure 15:
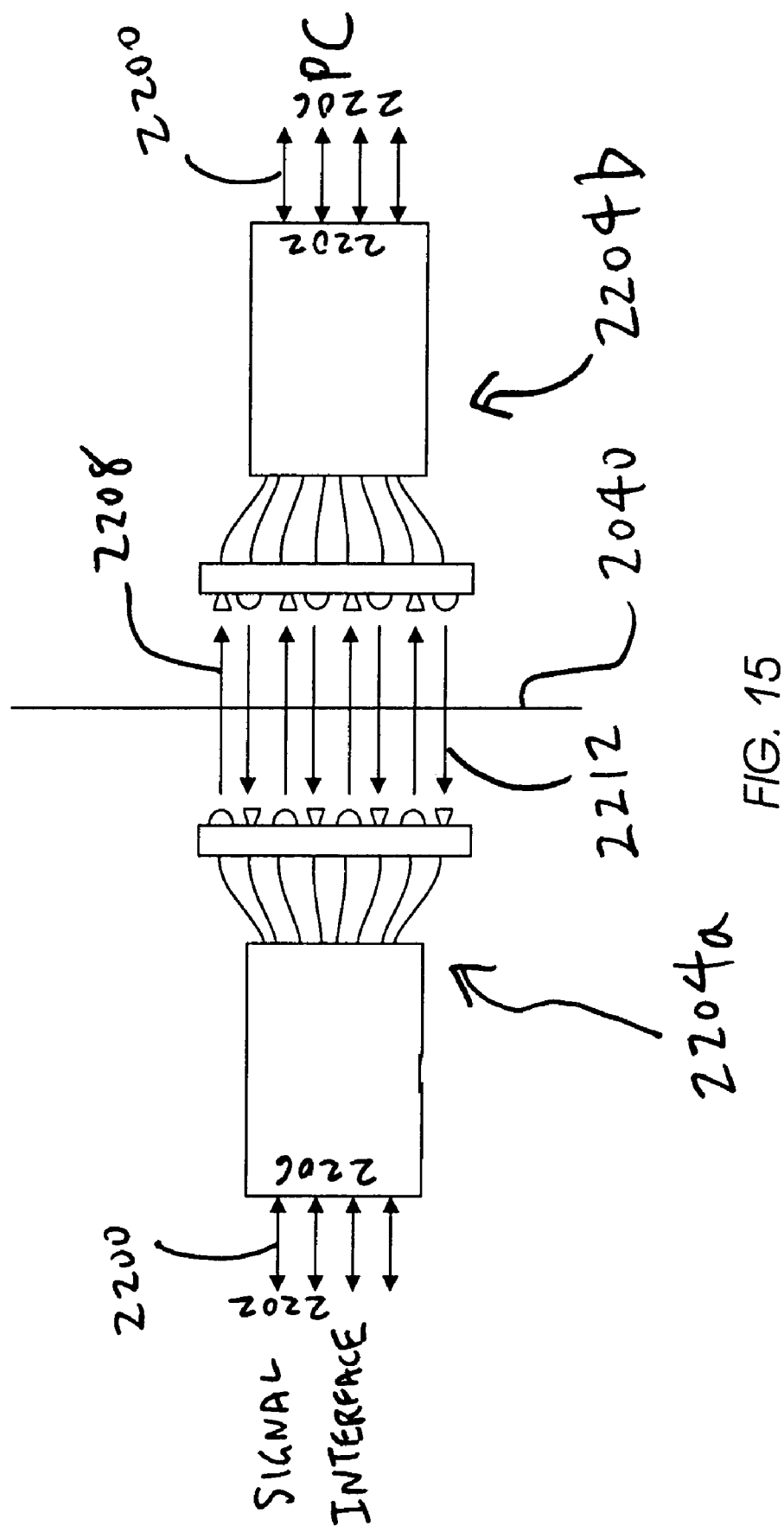
FIG. 15 is a sketch illustrating conversion of USB electrical signals (pictures) to optical signals for transmission to devices external to the invention.

Alternatively picture signals may be transmitted exterior to the invention optically. Preferably the picture signals output by the signal interface conform to the United Serial Bus (USB) protocol. A schematic of devices which convert USB signals to optical signals is illustrated in FIG. 15.

In order to obviate the necessity of redesigning the lens 2001 for operation within dielectric potting material 2030 the lens 2001 can be contained within a chamber 2066 so that potting material 2030 is kept away from the lens 2001 during molding of the enclosure. In order to prevent fogging of the lens 2001 this chamber should be filled with dry air 2068.

In order to allow replacement of the battery 2008 it may be separately contained within another chamber 2070. This chamber must go through and be flush with the exterior wall 2040 of the enclosure. In this way, the battery can be embedded within a semi-rigid encapsulant 2074 by well known techniques. The outer surface of this semi-rigid encapsulant 2074 becomes flush with the exterior wall 2040 of the enclosure. Later on, the semi-rigid encapsulant 2074 may be removed, the battery 2001 replaced, and the cavity 2070 resealed with semi-rigid encapsulant 2074 by well known techniques.

Figure 14:
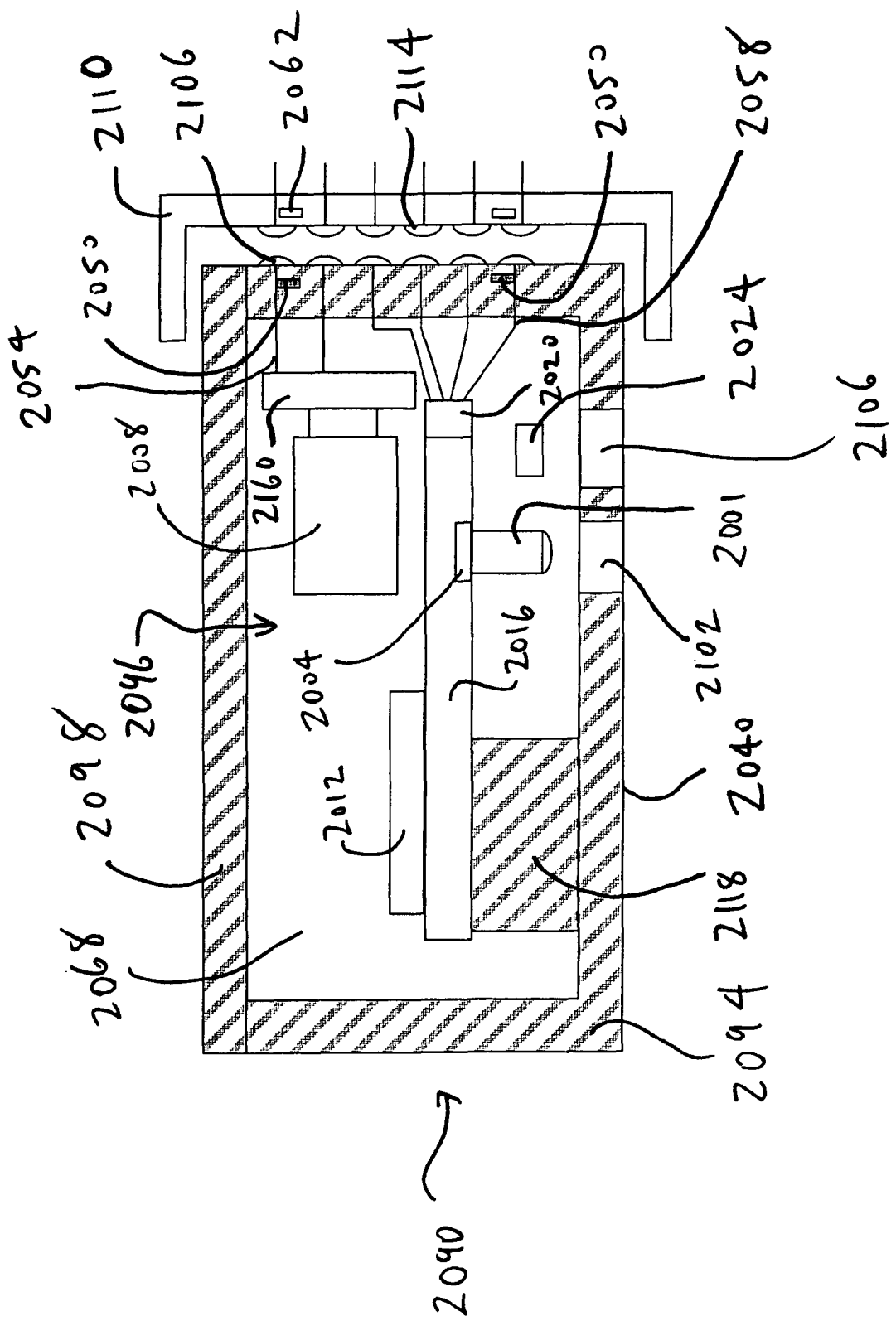
FIG. 14 is a cross-sectional plan diagram of yet another embodiment of this invention in which components of a digital electronic camera are contained within a hermetically sealed chamber, and connections for downloading and recharging are made via external contacts which mate with a cradle.

FIG. 14 is a cross-sectional plan diagram of yet another embodiment of this invention Much of the interconnect wiring and some components are not shown for clarity of comprehension. In addition, external activating controls are also not illustrated. The external controls are constructed in accordance with the previous descriptions.

In this embodiment, digital camera is understood to mean the components without the case. The major components that will be discussed are the lens 2001, the charge coupled device 2004, a rechargeable power source or battery 2008, an electronic storage device 2012 for storing pictures taken by the digital electronic camera in digital electronic form, control electronics 2016, a signal interface 2020 for downloading the pictures from the electronic storage device and the flash unit. 2024.

All components 2001, 2004, 2008, 2012, 2016, 2020 and 2024 are enclosed in hermetically sealed enclosure 2090 so that the lens 2001 is positioned normal to one wall 2040 of the enclosure 2090. The enclosure is preferably made from a box 2094 having an open side 2096 with a lid 2098 fastened on to this open side 2096. The box 2094 and lid 2098 are preferably made from thick plastic. The box 2094 is preferably injection molded so that it has no seams. The lid 2098 is preferably attached to the box 2094 by ultrasonic welding. The components are supported within the enclosure 2090 by appropriate support blocks 2118 attached to the interior of the enclosure 2090. In this way the components are hermetically sealed water and air tight and the entire invention can be immersed to great depth within the ocean without crushing. In order to prevent fogging of the lens 2001 enclosure 2090 should be filled with dry air 2068.

The plastic that the enclosure 2090 is made of can be any color but it must be transparent in the area 2102 of the lens 2001 and the area 2106 of the flash 2024 so that pictures may be taken through the enclosure 2090.

This embodiment, similarly to other embodiments, must be able to communicate with devices eternal to the invention for recharging the power source 2008 and downloading the pictures from the storage device 2012 via the signal interface 2020. Preferably, in this embodiment, communication is via a through the wall 2040 connector 2042. See FIG. 12. Alternatively, connection is made via a set of contacts a set of contacts 2106 on the exterior 2040 of the enclosure 2090. To prevent corrosion of the contact 2106 by salt water, they should be gold plated. To prevent shorting between contacts 2106 in salt water, a normally open magnetic switch 2050 is included in one connection 2054 to the battery 2008 and in one connection 2058 to the signal interface 2020. The mating cradle 2110 contains mating contacts 2114 and a magnet 2062 so that the magnetic switches 2050 close and connections can be made for recharging and downloading.

Alternatively picture signals may be transmitted exterior to the invention optically. Preferably the picture signals output by the signal interface conform to the United Serial Bus (USB) protocol. A schematic of devices which convert USB signals to optical signals is illustrated in FIG. 15.

In order to allow replacement of the battery 2008 it may be separately contained within another chamber 2070. See FIG. 12.

In another alternative, charge in the battery 2008 may be monitored by a monitor device 2160 which then controls the charging current.

FIG. 15 is a sketch illustrating conversion of USB electrical signals (pictures) to optical signals for transmission to devices external to the invention. Typically a USB device outputs 4 signals 2202 on 4 channels 2200 and receives 4 signals 2206 on the same channels 2200. The output signals 2202 from the signal interface 2020 go to an electrical to optical converter 2204a which converts the output signals 2202 to four optical signals 2208. These are transmitted across the wall 2040 to another electrical to optical converter 2204b. In this converter 2204b the optical signals 2208 are converted to output electrical signals 2202 again for transmission over 4 channels to the PC.

In the other direction input signals 2206 from the PC are converted in the converter 2204b to 4 input optical signals 2212, transmitted across the wall to the other converter 2204a, where they are converted to 4 input signals 2206 again for transmission to the signal interface 2202.

10. Recapitulation, and Extension, of the Concepts of the Present Invention

There are at least four primary features to the waterproof digital electronic camera system of the present invention. First, the method of designing the housing within the housing accords for an air space which contains the camera or at least the camera optics. Second, the design of the electronic switches permits operator control of the camera while it is submerged nonetheless that this these switches require no holes through the housing whatsoever, thus preserving the water-tight integrity of the housing. Third, the method of recharging the battery of the camera does not require opening of the housing, nor the presence of any holes or penetrating pins or wires in the housing. Fourth, the infrared or radio interface to a communicating PC requires neither any opening of the casing, nor any openings in the casing.

These concepts of the present invention described herein this specification are of broad applicability. Namely, the concepts of (i) potting the auxiliary electronics and the digital electronic camera together to provide an inexpensive water-tight housing, (ii) magnetically activating essential switches of the both the momentary and dual-state types, (iii) communicating data to a computer upon an infrared or radio data interface through a clear housing, (iv) breaking or otherwise disrupting a frangible or removable seal to optionally replace a battery, (v) filling the housing with a dielectric fluid which may either remain liquid or solidify, and (vi) still other concepts, can all be applied to diverse underwater devices other than digital electronic cameras.

For example, an underwater light could be made using these design features. Also, an all-digital video camera, which are now available, can be housed the same way, and the pictures retrieved to a computer interface, in the identical manner as the digital electronic still camera of the present invention.

Accordingly, the concepts of the present invention should be understood to be broadly applicable to digital electronic equipments deployed in underwater, marine, adverse weather and contaminated environments of various natures.

By way of a further particular example, and underwater digital watch can greatly benefit by several of the concepts of the present invention. The watch may employ each and any of the (i) encapsulating housing, (ii) inductively coupled battery recharging, and/or (ii) magnetically actuated switching concepts of the present invention. The may be, in particular, completely potted and sealed in strong plastic for underwater operation.

In accordance with the preceding explanation, variations and adaptations of the hermetically sealed digital electronic camera system in accordance with the present invention will suggest themselves to a practitioner of the electronics and optics packaging arts. For example, data could be communicated to and from the camera over and inductive electrical link in the manner of U.S. Pat. No. 5,455,466. A design need not embrace each and every disparate aspect of the present invention to be within the scope of the invention, as defined by the attached claims. At least when the battery is not replaced, the underwater camera of the present invention is the first, to the inventor's knowledge, to house a function camera in a case that is totally without such holes, or orifices, as have commonly previously fitted mechanisms for transmitting mechanical forces, or wires for communicating electrical power and/or signals. Even if the battery replacement option is employed, the hermetically sealed digital electronic camera system of the present invention can fairly be described as "seal-less" in that its case, while certainly "sealed", has no "seals" in the sense that some crack or orifice through which water and/or contamination might otherwise enter has to be "patched over" with a "seal" that otherwise permits the movement of something—mechanical force or electricity or whatever—through the region of the seal.

In summary, the lack of air inside the camera of the present invention permits leak proof operation at considerable depths which, hitherto, only much more costly cameras could provide. Additionally, the lack of need for any seals provides a guarantee against leakage at moderate depths which even the most costly underwater cameras do not currently provide.

In accordance with these and other possible variations and adaptations of the present invention, the scope of the invention should be determined in accordance with the following claims, only, and not solely in accordance with that embodiment within which the invention has been taught.

What is claimed is:

1. A waterproof digital electronic camera system comprising:
   a) a digital electronic camera having a lens, a charge coupled device, a rechargeable power source, an electronic storage device for storing pictures taken by said digital electronic camera in digital electronic form, control electronics, and a signal interface for downloading said pictures from said electronic storage device;
   b) an enclosure means for hermetically sealing water and air tight and supporting said digital electronic camera within said enclosure means so that said lens is positioned normal to one wall of said enclosure means; said enclosure means being transparent in at least an area of said lens so that pictures may be taken through said enclosure means; said enclosure means comprising a plurality of sides, wherein at least one side of said plurality of sides comprises a lid and at least three sides of said plurality of sides are seamlessly formed, such that the lid is permanently and securely attached to the at least three sides and said enclosure means being filled with dry air;
   c) means for recharging said power source from a charger external to said enclosure, said means for recharging including:
      i) a connector;
      ii) an electrical connection electrically connecting said connector to said rechargeable power source; and
      iii) a normally open magnetic switch in said electrical connection operable under the influence of a magnet exterior to the system to close a circuit that transmits power to a contact exposed at an exterior surface of the system; and
   d) means for downloading pictures from said electronic storage device via said signal interface to a remote storage device external to said enclosure.

2. An assembly comprising the waterproof digital electronic camera system according to claim 1 and a mating connector, said mating connector including said magnet and designed to mate with said connector.

3. A waterproof digital electronic camera system comprising:
   a) a digital electronic camera having a lens, a charge coupled device, a rechargeable power source, an electronic storage device for storing pictures taken by said digital electronic camera in digital electronic form, control electronics, and a signal interface for downloading said pictures from said electronic storage device;
   b) an enclosure means for hermetically sealing water and air tight and supporting said digital electronic camera within said enclosure means so that said lens is positioned normal to one wall of said enclosure means; said enclosure means being transparent in at least an area of said lens so that pictures may be taken through said enclosure means; said enclosure means comprising a plurality of sides, wherein at least one side of said plurality of sides comprises a lid and at least three sides of said plurality of sides are seamlessly formed, such that the lid is permanently and securely attached to the at least three sides and said enclosure means being filled with dry air;
   c) means for recharging said power source from a charger external to said enclosure; and
   d) means for downloading pictures from said electronic storage device via said signal interface to a remote storage device external to said enclosure, said means for downloading including:
      i) a connector;
      ii) an electrical connection electrically connecting said connector to said signal interface; and
      iii) a normally open magnetic switch in said electrical connection operable under the influence of a magnet exterior to the system to close a circuit that transmits a signal to a contact exposed at an exterior surface of the system.

4. An assembly comprising the waterproof digital electronic camera system according to claim 3 and a mating connector, said mating connector including said magnet and designed to mate with said connector.

5. A waterproof digital electronic camera system comprising:
   a) a digital electronic camera having a lens, a charge coupled device, a rechargeable power source, an electronic storage device for storing pictures taken by said digital electronic camera in digital electronic form, control electronics, and a signal interface for downloading said pictures from said electronic storage device;
   b) an enclosure means for hermetically sealing water and air tight and supporting said digital electronic camera within said enclosure means so that said lens is positioned normal to one wall of said enclosure means; said enclosure means being transparent in at least an area of said lens so that pictures may be taken through said enclosure means; said enclosure means comprising a plurality of sides, wherein at least one side of said plurality of sides comprises a lid and at least three sides of said plurality of sides are seamlessly formed, such that the lid is permanently and securely attached to the at least three sides and said enclosure means being filled with dry air;
   c) means for recharging said power source from a charger external to said enclosure, said means for recharging including:
      i) a set of contacts on the exterior of said enclosure means;
      ii) a set of electrical connections connecting said set of electrical contacts with said rechargeable power source; and
      iii) a normally open magnetic switch in one of said electrical connections operable under the influence of a magnet exterior to the system to close a circuit that transmits power to a contact exposed at an exterior surface of the system; and
   d) means for downloading pictures from said electronic storage device via said signal interface to a remote storage device external to said enclosure.

6. An assembly comprising the waterproof digital electronic camera system according to claim 5 and a set of mating contacts, said set of mating contacts including said magnet and designed to mate with said set of contacts.

7. A waterproof digital electronic camera system comprising:
   a) a digital electronic camera having a lens, a charge coupled device, a rechargeable power source, an electronic storage device for storing pictures taken by said digital electronic camera in digital electronic form, control electronics, and a signal interface for downloading said pictures from said electronic storage device;
   b) an enclosure means for hermetically sealing water and air tight and supporting said digital electronic camera within said enclosure means so that said lens is positioned normal to one wall of said enclosure means; said enclosure means being transparent in at least an area of said lens so that pictures may be taken through said enclosure means; said enclosure means comprising a plurality of sides, wherein at least one side of said plurality of sides comprises a lid and at least three sides of said plurality of sides are seamlessly formed, such that the lid is permanently and securely attached to the at least three sides and said enclosure means being filled with dry air;

c) means for recharging said power source from a charger external to said enclosure; and d) means for downloading pictures from said electronic storage device via said signal interface to a remote storage device external to said enclosure, said means for downloading including:
   i) a set of contacts on the exterior of said enclosure means;
   ii) a set of electrical connections connecting said set of electrical contacts with said signal interface; and
   iii) a normally open magnetic switch in one of said electrical connections operable under the influence of a magnet exterior to the system to close a circuit that transmits a signal to a contact exposed at an exterior surface of the system.

8. An assembly comprising the waterproof digital electronic camera system according to claim 7 and a set of mating contacts, said set of mating contacts including said magnet and designed to mate with said set of contacts.

9. A waterproof digital electronic camera system comprising:

a) a digital electronic camera having a lens, a charge coupled device, a rechargeable power source, an electronic storage device for storing pictures taken by said digital electronic camera in digital electronic form, control electronics, and a signal interface for downloading said pictures from said electronic storage device;

b) an enclosure means for hermetically sealing water and air tight and supporting said digital electronic camera within said enclosure means so that said lens is positioned normal to one wall of said enclosure means; said enclosure means being transparent in at least an area of said lens so that pictures may be taken through said enclosure means; said enclosure means comprising a plurality of sides, wherein at least one side of said plurality of sides comprises a lid and at least three sides of said plurality of sides are seamlessly formed, such that the lid is permanently and securely attached to the at least three sides and said enclosure means being filled with dry air;

c) means for recharging said power source from a charger external to said enclosure; and d) means for downloading pictures from said electronic storage device via said signal interface to a remote storage device external to said enclosure, wherein said means for downloading includes an optical converter operable to convert first electrical signals to first optical signals and to transmit said first optical signals to a device external to the system, said optical converter further being operable to receive second optical signals from said device external to the system and to convert said second optical signals to second electrical signals.

10. A waterproof digital electronic camera system comprising:

a) a digital electronic camera having a lens, a charge coupled device, a rechargeable power source, an electronic storage device for storing pictures taken by said digital electronic camera in digital electronic form, control electronics, and a signal interface for downloading said pictures from said electronic storage device;

b) an enclosure means for hermetically sealing water and air tight and supporting said digital electronic camera within said enclosure means so that said lens is positioned normal to one wall of said enclosure means; said enclosure means being transparent in at least an area of said lens so that pictures may be taken through said enclosure means; said enclosure means comprising a plurality of sides, wherein at least one side of said plurality of sides comprises a lid and at least three sides of said plurality of sides are seamlessly formed, such that the lid is permanently and securely attached to the at least three sides and said enclosure means being filled with dry air;

c) means for recharging said power source from a charger external to said enclosure; and d) means for downloading pictures from said electronic storage device via said signal interface to a remote storage device external to said enclosure, wherein said means for downloading includes an optical converter operable to convert first electrical signals to first optical signals and to transmit said first optical signals to a device external to the system through a wall of said enclosure means, said optical converter further being operable to receive second optical signals from said device external to the system through said wall and to convert said second optical signals to second electrical signals;

wherein said signal interface and means for downloading conform to the United Serial Bus (USB) protocol.

* * * * *